(12) United States Patent　　(10) Patent No.: US 12,581,633 B2

Kitagawa　　(45) Date of Patent: Mar. 17, 2026

(54) COMPONENT MOUNTING PROGRAM

(71) Applicant: FUJI CORPORATION, Chiryu (JP)

(72) Inventor: Masahiro Kitagawa, Takahama (JP)

(73) Assignee: FUJI CORPORATION, Chiryu (JP)

( * ) Notice: Subject to any disclaimer, the term of this patent is extended or adjusted under 35 U.S.C. 154(b) by 863 days.

(21) Appl. No.: 17/760,022

(22) PCT Filed: Feb. 13, 2020

(86) PCT No.: PCT/JP2020/005591

§ 371 (c)(1),
(2) Date: Aug. 3, 2022

(87) PCT Pub. No.: WO2021/161458

PCT Pub. Date: Aug. 19, 2021

(65) Prior Publication Data

US 2023/0043107 A1　　Feb. 9, 2023

(51) Int. Cl.
　H05K 13/08　　(2006.01)
　H05K 13/04　　(2006.01)
(52) U.S. Cl.
　CPC ....... H05K 13/084 (2018.08); H05K 13/0419 (2018.08)
(58) Field of Classification Search
　CPC .......... H05K 13/0417; H05K 13/0419; H05K 13/0421; H05K 13/0426; H05K 13/0812;

H05K 13/084; H05K 13/086; Y10T 29/4913; Y10T 29/49139; Y10T 29/53174; Y10T 29/53183

See application file for complete search history.

(56) References Cited

FOREIGN PATENT DOCUMENTS

| JP | 2002-271092 A | | 9/2002 |
|---|---|---|---|
| JP | 2003188591 A | * | 7/2003 |
| JP | 2008028367 A | * | 2/2008 |
| JP | 2015-176970 A | | 10/2015 |

OTHER PUBLICATIONS

JP-2003188591-A Translation from FIT database (Year: 2025).*
JP-2008028367-A Translation from FIT database (Year: 2025).*
International Search Report Issued Apr. 21, 2020, in PCT/JP2020/005591, filed on Feb. 13, 2020, 2 pages.

* cited by examiner

*Primary Examiner* — Jeffrey T Carley
*Assistant Examiner* — Joshua D Anderson
(74) *Attorney, Agent, or Firm* — Oblon, McClelland, Maier & Neustadt, L.L.P.

(57)　　ABSTRACT

A component mounting program for mounting a component on a board, the component mounting program being configured to identify whether a component supplied from a tape feeder on the component mounting program is a component supplied from a sequential taped component or a component supplied from a taped component other than the sequential taped component.

1 Claim, 9 Drawing Sheets

COMPONENT MOUNTING PROGRAM

TECHNICAL FIELD

The present disclosure relates to a component mounting program for mounting a component on a board.

BACKGROUND ART

Patent Literature below describes a technique in which a taped component with components taped is set in a tape feeder, and a component supplied from the taping component is mounted on a board.

PATENT LITERATURE

Patent Literature 1: JP-A-2015-176970

BRIEF SUMMARY

Technical Problem

The present disclosure has an object to appropriately supply a component from a taped component.

Solution to Problem

In order to solve the above-mentioned problems, the present specification discloses that a component mounting program for mounting a component on a board, the component mounting program being configured to identify whether a component supplied from a tape feeder on the component mounting program is a component supplied from a sequential taped component or a component supplied from a taped component other than the sequential taped component.

Advantageous Effects

With the present disclosure, in a mounting program, it is possible to identify whether a component, which is a mounting target, is a component supplied from a sequential taped component or a component supplied from a taped component other than the sequential taped component. As a result, the component can be appropriately supplied according to the type of taped component.

DESCRIPTION OF EMBODIMENTS

Hereinafter, as exemplary embodiments of the present disclosure, examples of the present disclosure will be described in detail with reference to drawings.

Figure 1:
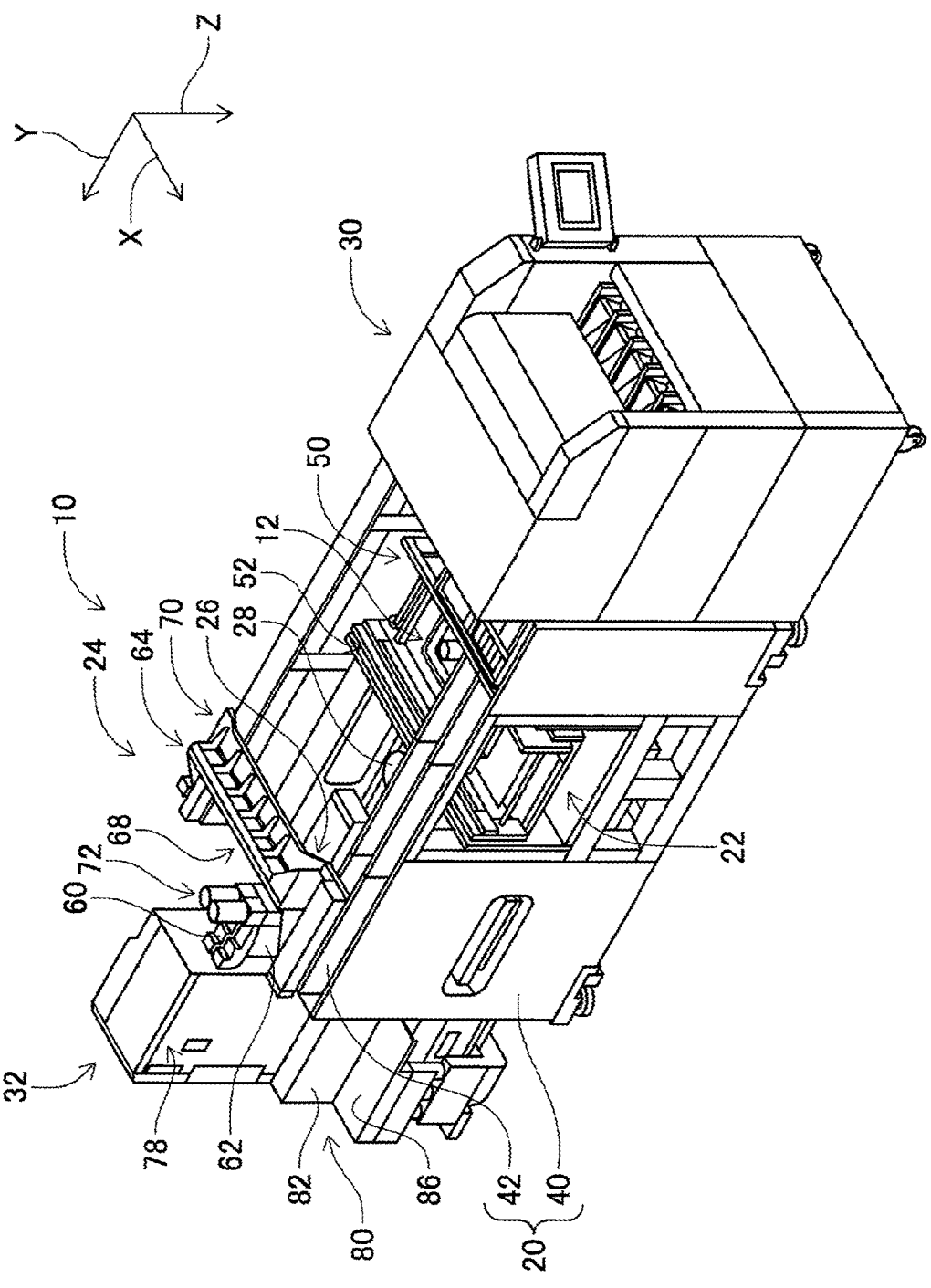
FIG. 1 is a perspective view illustrating a component mounter.

FIG. 1 illustrates component mounter 10. Component mounter 10 is a device for executing a component mounting work on circuit base material 12. Component mounter 10 includes device main body 20, base material conveyance and holding device 22, component mounting device 24, imaging devices 26 and 28, bulk component supply device 30, component supply device 32, and control device 36 (refer to FIG. 5). Examples of circuit base material 12 include a circuit board, a base material having a three-dimensional structure, and the like, and examples of circuit board include a printed wiring board, a printed circuit board, and the like.

Device main body 20 is configured by frame 40 and beam 42 suspended on frame 40. Base material conveyance and holding device 22 is disposed at a center of frame 40 in a front-rear direction and has conveyance device 50 and clamp device 52. Conveyance device 50 is a device for conveying circuit base material 12, and clamp device 52 is a device for holding circuit base material 12. As a result, base material conveyance and holding device 22 conveys circuit base material 12 and holds circuit base material 12 fixedly at a predetermined position. In the following description, a conveyance direction of circuit base material 12 will be referred to as an X-direction, a horizontal direction perpendicular to that direction will be referred to as a Y-direction, and a vertical direction will be referred to as a Z-direction. That is, a width direction of component mounter 10 is the X-direction, and a front-rear direction is the Y-direction.

Figure 2:
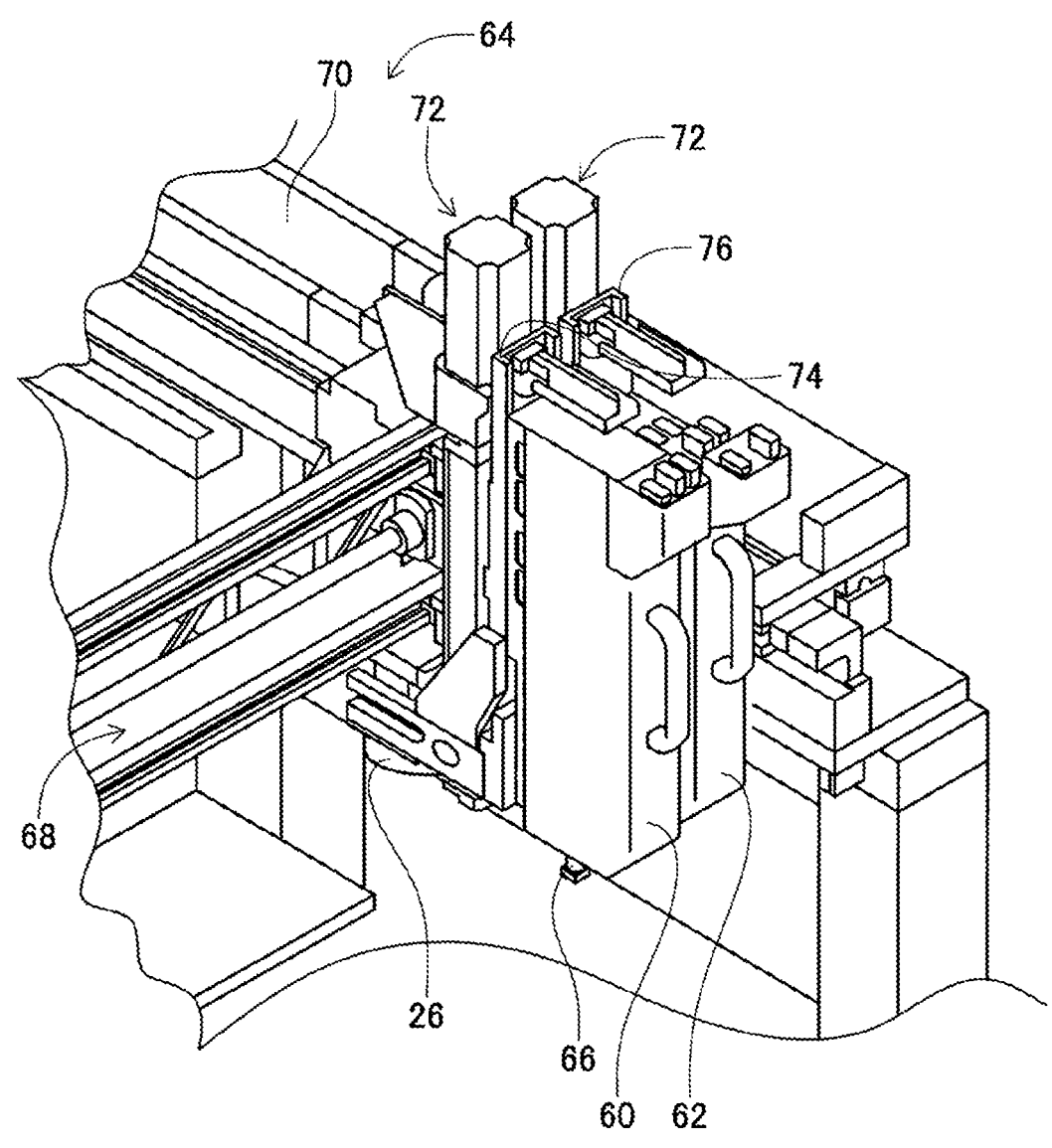
FIG. 2 is a perspective view illustrating a component mounting device of the component mounter.

Component mounting device 24 is disposed on beam 42 and includes two work heads 60 and 62 and work head moving device 64. As illustrated in FIG. 2, chucks 66 are detachably provided on lower end faces of work heads 60 and 62, and the component is held by chucks 66. In addition, work head moving device 64 includes X-direction moving device 68, Y-direction moving device 70, and Z-direction moving device 72. Then, two work heads 60 and 62 are integrally moved to any position on frame 40 by X-direction moving device 68 and Y-direction moving device 70. In addition, each of work heads 60 and 62 is detachably positioned and mounted on sliders 74 and 76 through a one-touch action without using any tool, and Z-direction moving devices 72 individually move sliders 74 and 76 in an up-down direction. That is, work heads 60 and 62 are moved in the up-down direction individually by Z-direction moving devices 72.

Imaging device 26 is attached to slider 74 in downward facing state on the vertical axis, and is moved in the X-direction, the Y-direction, and the Z-direction together with work head 60. As a result, imaging device 26 images any position on frame 40. As illustrated in FIG. 1, imaging device 28 is disposed between base material conveyance and holding device 22 on frame 40 and component supply device 32 in such a state that imaging device 28 is directed upward on the vertical axis. As a result, imaging device 28 images the component held by chucks 66 of work heads 60 and 62. Imaging devices 26 and 28 are two-dimensional cameras, and image two-dimensional images.

Bulk component supply device 30 is disposed at one end portion of frame 40 in the front-rear direction. Bulk component supply device 30 is a device that aligns multiple components in a scattered state and supplies the components in an aligned state. That is, bulk component supply device 30 is a device that aligns multiple components in any posture to a predetermined posture, and supplies the components of the predetermined posture.

Component supply device 32 is disposed at the other end portion of frame 40 in the front-rear direction. Component supply device 32 includes tray-type component supply device 78 and feeder-type component supply device 80. Tray-type component supply device 78 is a device that supplies the component in a state in which the component is placed on a tray. Feeder-type component supply device 80 is a device that supplies the component by tape feeder 82, or is a bulk component feeder device that supplies multiple components in a scattered state. Hereinafter, the structure of tape feeder 82 will be described, but since the structure of tape feeder 82 is described in detail in Japanese Patent Application No. 2019-150273 filed by the present applicant, it will be described in a simplified manner.

Tape feeder 82 is detachably positioned and mounted in a slot of tape feeder holding stand 86 fixedly provided at the other end portion of frame 40 through a one-touch action. Tape feeder 82 is a taped lead component supply device that removes the axial component from taped component 88 (refer to FIG. 3), and supplies the removed axial component to work heads 60 and 62 in a state in which the lead wires of the axial component are bent. Taped component 88 is a general taped component, and is referred to as usual taped component 88 in order to distinguish it from the sequential taped component which will be described in detail later.

Figure 3:
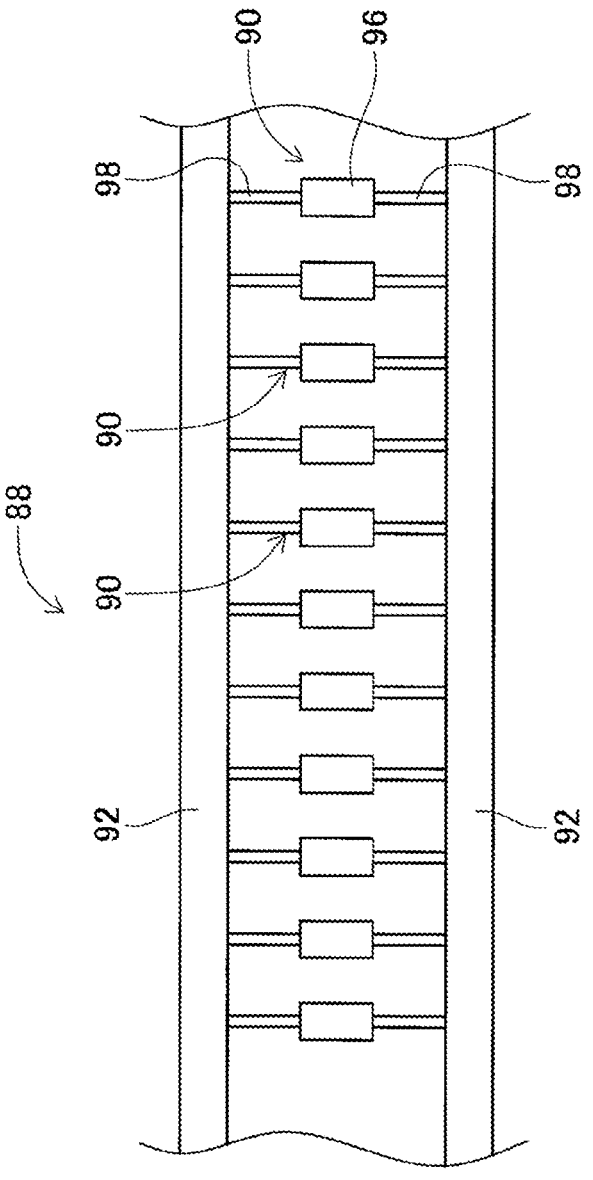
FIG. 3 is a schematic diagram illustrating a usual taped component.

As illustrated in FIG. 3, usual taped component 88 is configured with multiple axial components 90 and two carrier tapes 92. Multiple axial components 90 are all the same type components, and each axial component 90 generally includes a cylindrical component main body 96 and two lead wires 98. Two lead wires 98 each have a generally straight-line shape and are individually fixed to corresponding both end faces of component main body 96 in such a manner as to be coaxial with an axial center of component main body 96. Then, axial component 90 is taped into two carrier tapes 92 at tip ends of two lead wires 98, that is, at the ends opposite to component main body 96 in a state of being sandwiched between two carrier tapes 92. Multiple axial components 90 are taped into two carrier tapes 92 at equal pitches.

Figure 4:
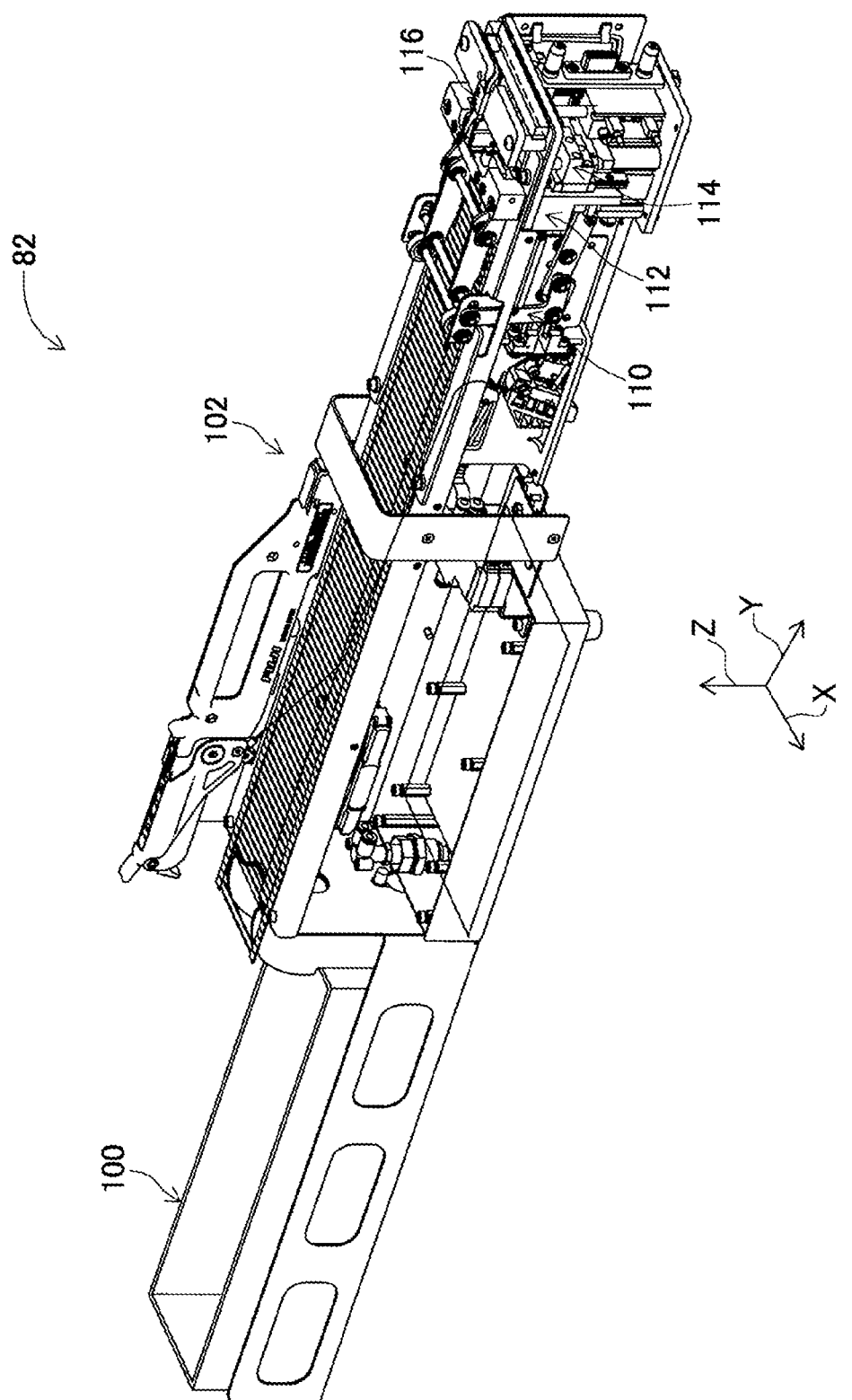
FIG. 4 is a perspective view illustrating a tape feeder.

As illustrated in FIG. 4, tape feeder 82 is configured with accommodation box 100 and feeder main body 102. In the following description, a direction from accommodation box 100 to feeder main body 102 is described as front, and a direction from feeder main body 102 to accommodation box 100 is described as rear. Usual taped component 88 is accommodated in accommodation box 100 in a folded state. Usual taped component 88 accommodated in accommodation box 100 is pulled out, and usual taped component 88 so pulled out extends over an upper end face of feeder main body 102.

Feeding device 110, lead cutting device 112, bending device 114, and detection sensor 116 are disposed in feeder main body 102. Feeding device 110 feeds usual taped component 88 extending over the upper face of feeder main body 102 toward the front. At this time, feeding device 110 feeds usual taped component 88 at the same pitch as the installation pitch of axial component 90 taped on usual taped component 88. Lead cutting device 112 is disposed on a front side of feeding device 110, and lead cutting device 112 cuts a pair of lead wires 98 of usual taped component 88 at a predetermined position every time usual taped component 88 is fed by feeding device 110. As a result, one axial component 90 is separated from usual taped component 88.

Then, bending device 114 clamps the pair of lead wires 98 of axial component 90 that is separated from usual taped component 88, and bending device 114 rises in a state in which the pair of lead wires 98 of axial component 90 is clamped. At this time, when the pair of lead wires 98 abuts on a pair of bending rollers (not illustrated) disposed upward, the tip end portion of the outer side of the portion where the pair of lead wires 98 is clamped is bent to be directed downward. Then, in a position where bending device 114 is raised, axial component 90 in a state where the pair of lead wires 98 is bent is supplied. That is, the position where bending device 114 is raised is a component supply position of tape feeder 82, and axial component 90 is supplied at that position. Detection sensor 116 is disposed at the supply position of tape feeder 82, and the presence or absence of axial component 90 at the supply position is detected by detection sensor 116.

Figure 5:
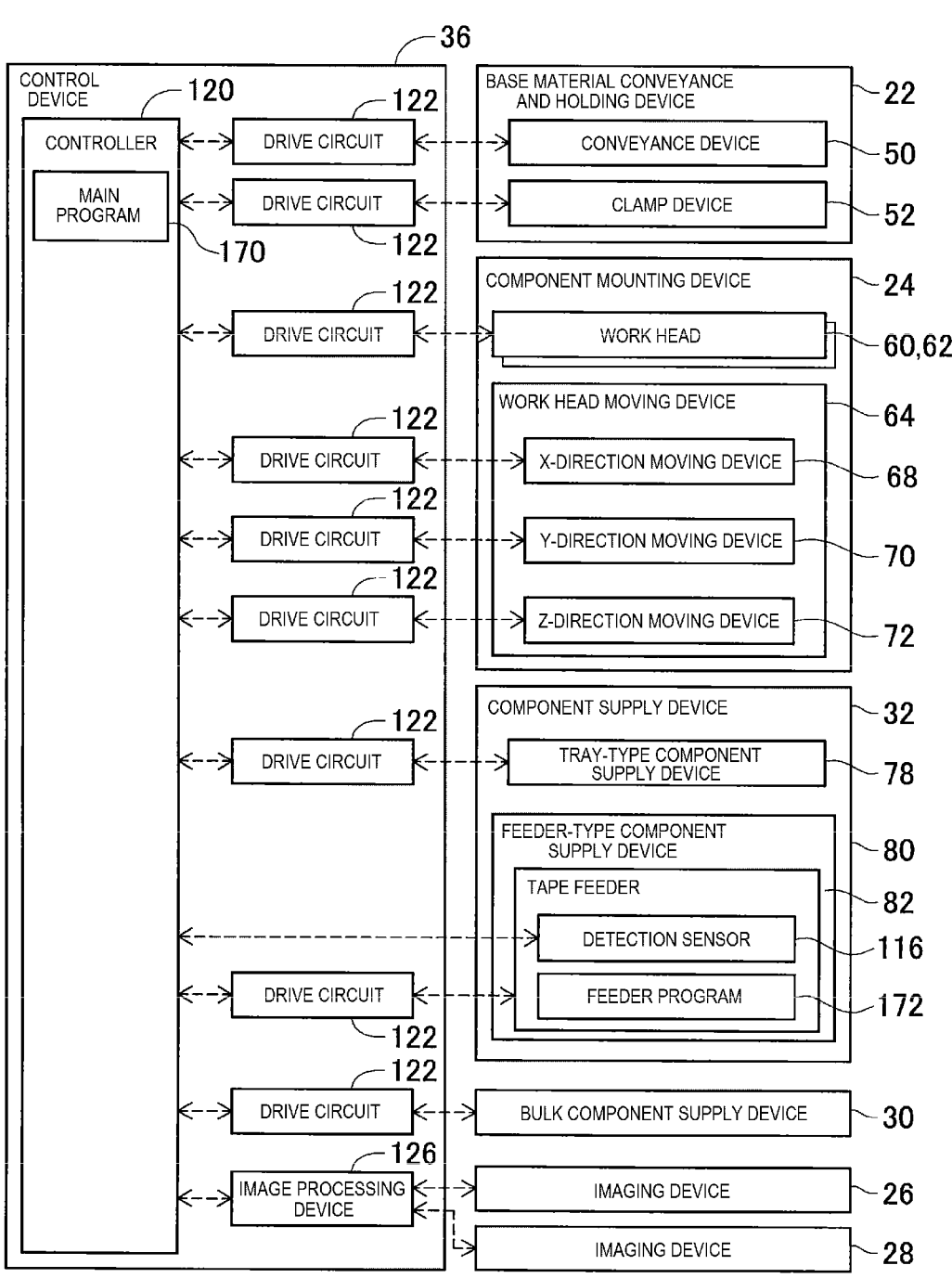
FIG. 5 is a block diagram illustrating a control device.

As illustrated in FIG. 5, control device 36 includes controller 120, multiple drive circuits 122, and image processing device 126. Multiple drive circuits 122 are connected to conveyance device 50, clamp device 52, work heads 60 and 62, X-direction moving device 68, Y-direction moving device 70, Z-direction moving device 72, tray-type component supply device 78, tape feeder 82, and bulk component supply device 30. Controller 120 is provided with CPU, ROM, RAM, and the like, is mainly a computer, and is connected to multiple drive circuits 122. With this, controller 120 controls operations of base material conveyance and holding device 22, component mounting device 24, and the like. Controller 120 is also connected to image processing device 126. Image processing device 126 processes the image data obtained by imaging devices 26 and 28, and controller 120 acquires various types of information from the image data. In addition, controller 120 is also connected to detection sensor 116 of tape feeder 82. As a result, controller 120 acquires a detection value by detection sensor 116.

In component mounter 10, with the configuration that has been described heretofore, a component mounting work is executed on circuit base material 12 held by base material conveyance and holding device 22. Specifically, conveyance device 50 conveys circuit base material 12 to the work position in accordance with an instruction from controller 120, and clamp device 52 holds circuit base material 12 fixedly at that position. Next, imaging device 26 moves above circuit base material 12 in accordance with the instruction from controller 120, and images circuit base material 12. As a result, controller 120 acquires information which relates to the positions of a pair of through holes (not illustrated) formed in circuit base material 12. In addition, bulk component supply device 30 or component supply device 32 supplies the component to work heads 60 and 62 at a predetermined supply position. Here, the supply of axial component 90 by tape feeder 82 of component supply device 32 will be described.

In a case where the component, which is the mounting target, is the component supplied from usual taped component 88, controller 120 outputs a first feed command to tape feeder 82. When receiving the first feed command, tape feeder 82 operates feeding device 110, lead cutting device 112, and bending device 114 to execute a supply work of axial component 90. When executing the supply work of axial component 90, tape feeder 82 detects whether the component is present at the supply position by detection sensor 116. At this time, normally, when detection sensor 116 detects that the component is present at the supply position, tape feeder 82 outputs information (hereinafter, referred to as "component presence information") indicating that the component is at the supply position to controller 120. When receiving the component presence information, controller 120 outputs an command to start a component mounting work on work heads 60 and 62 (hereinafter, referred to as a "component mounting start command"). As a result, work heads 60 and 62 move above the supply position of tape feeder 82, and hold axial component 90 at the supply position by chucks 66.

Subsequently, work heads 60 and 62 holding axial component 90 move above imaging device 28, and axial component 90 held by chucks 66 is imaged by imaging device 28. As a result, controller 120 acquires information as to the tip end positions of the pair of lead wires 98 of axial component 90 held by chucks 66. Subsequently, work heads 60 and 62 move above circuit base material 12 such that the pair of through holes of circuit base material 12 and the pair of lead wires 98 of axial component 90 are coincident in XY coordinates. Then, when work heads 60 and 62 are lowered, the pair of lead wires 98 of axial component 90 is inserted into the pair of through holes of circuit base material 12. As a result, axial component 90 is mounted on circuit base material 12.

On the other hand, in a case where tape feeder 82 that has received the first feed command from controller 120 executes the supply work of axial component 90 which is a usual taped component by the operation of feeding device 110 or the like, and the presence or absence of the component at the supply position is detected by detection sensor 116, the component may not be detected by detection sensor 116. Reasons for this include a taping mistake of the component in usual taped component 88, a positional deviation of the component due to a failure in cutting of lead wires 98 by lead cutting device 112, a clamping positional deviation of the lead wires caused by the clamp device, the lead wires being of the axial component separated from the carrier tape by bending device 114, a failure in clamping, or the like. As described above, in a case where the component is not detected by detection sensor 116 when the component is supplied from usual taped component 88, tape feeder 82 operates feeding device 110 or the like again without receiving the command from controller 120 to execute the supply work of axial component 90. Then, tape feeder 82 again detects the presence or absence of the component at the supply position by detection sensor 116. At this time, when detection sensor 116 detects that the component is present at the supply position, tape feeder 82 outputs the component presence information to controller 120, so that the mounting work of axial component 90 is executed as described above. As described above, when receiving the first feed command from controller 120, tape feeder 82 executes the supply work of axial component 90, and in a case where axial component 90 is not supplied to the supply position, tape feeder 82 repeatedly executes the supply work of axial component 90 until axial component 90 is supplied to the supply position. As a result, it is possible to appropriately supply axial component 90, which is a usual taped component, to the supply position of tape feeder 82.

Figure 6:
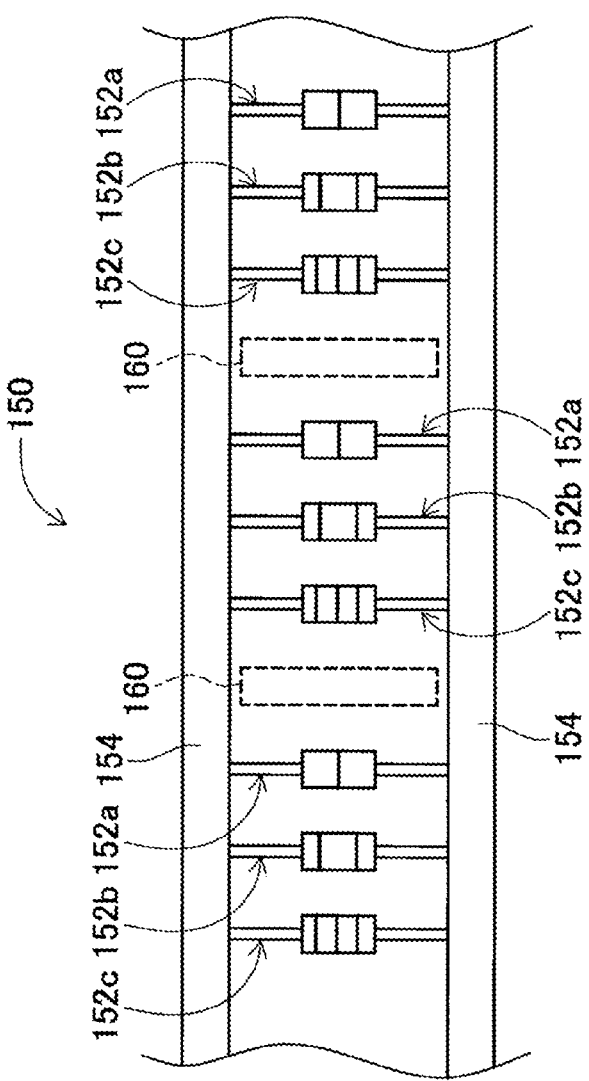
FIG. 6 is a schematic diagram illustrating a sequential taped component.

On the other hand, tape feeder 82 can supply not only axial component 90 from usual taped component 88 but also the axial component from the sequential taped component. As illustrated in FIG. 6, sequential taped component 150 is also configured with multiple axial components 152 and two carrier tapes 154 in the same manner as usual taped component 88. However, multiple axial components in units of panels or boards are collectively taped on sequential taped component 150. That is, for example, in a case where three types of axial components 152a, 152b, and 152c are components which are intended to be mounted on one panel or one board, the three types of axial components 152a, 152b, and 152c are continuously taped on carrier tape 154 at the feeding pitch of the taped component. These three types of axial components 152a, 152b, and 152c are repeatedly taped on carrier tape 154. That is, the three types of axial components 152a, 152b, and 152c that are continuously taped on carrier tape 154 are multiple axial components (hereinafter, referred to as a "component group") in units of panels or boards, and the component group is repeatedly taped on carrier tape 154. Space 160 where the component is not taped (hereinafter, referred to as an "empty taping space") is provided between two component groups. That is, the three types of axial components 152a, 152b, and 152c constituting a component group are taped on carrier tape 154 for each pitch which is the feeding pitch of the taped component and the components are not taped one pitch behind the component group, but empty taping space 160 is provided one pitch behind the component group. After two pitches from the component group, three types of axial components 152a, 152b, and 152c constituting a component group different from the former component group are taped on carrier tape 154 every pitch. In this manner, since empty taping space 160 is provided between two component groups, it is possible to confirm that the component mounting work on one panel or one board is completed. In other words, it is possible to confirm that the mounting work of one component group is completed.

Specifically, first, when an operator sets sequential taped component 150 in tape feeder 82, sequential taped component 150 is set in tape feeder 82, such that empty taping space 160 is positioned at the supply position of tape feeder 82. On the other hand, before circuit base material 12 is conveyed into component mounter 10 and the mounting work on circuit base material 12 is started, controller 120 outputs an command to confirm whether the component is present at the supply position of tape feeder 82 (hereinafter, referred to as a "component presence or absence confirmation command") to tape feeder 82. In addition, in a case where circuit base material 12 is configured with multiple boards, controller 120 outputs the component presence or absence confirmation command to tape feeder 82 not only when circuit base material 12 is conveyed into component mounter 10 but also when the mounting work on one board is completed, and before the mounting work on the other board is started. That is, in a case where the component, which is the target of the mounting work, is the component supplied from sequential taped component 150, controller 120 outputs the component presence or absence confirmation command to tape feeder 82 before newly starting the mounting work on one panel or one board.

Then, when tape feeder 82 receives the component presence or absence confirmation command, detection sensor 116 detects the presence or absence of the component at the supply position. At this time, since empty taping space 160 is generally positioned at the supply position, detection sensor 116 detects that the component is absent at the supply position, and tape feeder 82 outputs information indicating that the component is not at the supply position (hereinafter, referred to as "component absence information") to controller 120. When receiving the component absence information, controller 120 outputs a second feed command to tape feeder 82.

When receiving the second feed command, tape feeder 82 operates feeding device 110, lead cutting device 112, and bending device 114, and executes a supply work of axial component 152 to the supply position. Then, when tape feeder 82 executes the supply work of axial component 152, detection sensor 116 detects whether the component is present at the supply position. At this time, generally, detection sensor 116 detects that the component is present at the supply position, and tape feeder 82 outputs information indicating that the component is at the supply position, that is, the component presence information to controller 120. When receiving the component presence information, controller 120 outputs the command to start the component mounting work on work heads 60 and 62, that is, the component mounting start command. As a result, work heads 60 and 62 move above the supply position of tape feeder 82, and hold axial component 152 supplied at the supply position by chucks 66. Then, as described above, axial component 152 is imaged by imaging device 28, and the mounting work of axial component 152 on circuit base material 12 is executed.

On the other hand, in a case where tape feeder 82 that has received the second feed command from controller 120 executes the supply work of axial component 152 by the operation of feeding device 110 or the like, and detection sensor 116 detects the presence or absence of the component at the supply position, there may be a case where the component is not detected by detection sensor 116. Reasons for this, similar to the above-described reasons, include a taping mistake of the component in sequential taped component 150, a positional deviation of the component due to a failure in cutting of lead wires 98 by lead cutting device 112, a clamping position deviation of the lead wires of the axial component separated from the carrier tape by bending device 114, a failure in clamping, or the like. Thus, in a case where the component is not detected by detection sensor 116, as described above, when the component is supplied from usual taped component 88, tape feeder 82 executes the component supply work again, but when the component is supplied from sequential taped component 150, tape feeder 82 does not execute the component supply work again. In sequential taped component 150, in a case where the component is absent at the supply position even though the component supply work is executed, when the component supply work is executed again, there may be a case where the component is mounted at a position different from an intended mounting position.

Specifically, for example, in sequential taped component 150, in a case where it is determined that detection sensor 116 detects that the component is absent at the supply position even though axial component 152*a* is intended to be supplied at the supply position in a component mounting program when the component supply work is executed by tape feeder 82, axial component 152*b* is supplied to the supply position when tape feeder 82 executes the component supply work again. On the other hand, since axial component 152*a* is not supplied and the mounting work of axial component 152*a* on circuit base material 12 is not executed, as a matter of course, no component is mounted at the intended mounting position of axial component 152*a*. Therefore, when axial component 152*b* supplied at the supply position is held by work heads 60 and 62 and the component mounting work is executed, there may be a case where axial component 152*b* taped at the next position of axial component 152*a* is mounted at the intended mounting position of axial component 152*a*. As described above, in sequential taped component 150, in a case where the component is absent at the supply position even though the component supply work is executed, when the component supply work is executed again, there may be a case where the component is mounted at a position different from the intended position at which the component is mounted in the component mounting program.

Therefore, in the component mounting program, in a case where the component is not detected by detection sensor 116 even though the component supply work is executed when tape feeder 82 is supplied with the component from sequential taped component 150, tape feeder 82 does not execute the component supply work again. Instead, tape feeder 82 outputs information indicating that the component is not at the supply position, that is, the component absence information to controller 120. When receiving the component absence information, controller 120 executes an error notification, and outputs an command to stop the component mounting work on work heads 60 and 62, tape feeder 82, or the like (hereinafter, referred to as a "component mounting stop command"). Examples of error notification include error display on a display device (not illustrated) of component mounter 10, output of a warning sound by a speaker (not illustrated), lighting or blinking of a lamp or a light for notification. As a result, when the component mounting work is temporarily stopped, so that the operator recognizes the error, it is possible to execute putting out circuit base material 12, skipping the mounting work of axial component 152*a* that has not been supplied, or the like.

As described above, when the component is supplied from usual taped component 88 in the component mounting program, controller 120 outputs the first feed command to tape feeder 82. Then, when receiving the first feed command, tape feeder 82 executes the component supply work, but in a case where the supply work is executed and the component is not detected at the supply position by detection sensor 116, a re-supply of the component is executed. As a result, axial component 90 is supplied from usual taped component 88 on which the same type of component is taped, so that an appropriate mounting work of axial component 90 is secured. On the other hand, when the component is supplied from sequential taped component 150 in the component mounting program, controller 120 outputs the second feed command to tape feeder 82. Then, when receiving the second feed command, tape feeder 82 executes the component supply work, but does not execute the re-supply of the component even when the component is not detected by detection sensor 116 at the supply position even though the supply work is executed in the component mounting program. Instead, tape feeder 82 outputs the component absence information to controller 120. As a result, controller 120 executes the error notification and outputs the component mounting stop command, it is possible to prevent the component from being erroneously mounted at a position different from the intended mounting position.

In a case where the component is supplied from sequential taped component 150 in the component mounting program, as described above, controller 120 outputs the command to confirm the presence or absence of the component at the supply position (the component presence or absence confirmation command) to tape feeder 82 before newly starting the mounting work on one panel or one board, and tape feeder 82 detects the presence or absence of the component by detection sensor 116. At this time, in the component mounting program, since empty taping space 160 is positioned at the supply position before a new component group is mounted, detection sensor 116 detects that the component is absent at the supply position, but detection sensor 116 may detect that the component is present at the supply position. This is caused by, for example, an attachment defect or an attachment position error of sequential taped component 150 to tape feeder 82 by the operator, a defect in the taping of the component in sequential taped component 150, a case where other types of taped components other than the sequential tape are attached, or the like. As described above, originally, in a case where detection sensor 116 detects that the component is present at the supply position even though empty taping space 160 needs to be positioned at the supply position, there may be a case where a new mounting work on one panel or one board cannot be appropriately executed when the component mounting work is executed.

That is, in sequential taped component 150, as described above, empty taping space 160 is provided between two component groups. Then, since the position of the head of the new component group can be grasped by empty taping space 160 being positioned at the supply position of tape feeder 82 when controller 120 outputs the component presence or absence confirmation command at the supply position to tape feeder 82, the start of the mounting work on the position where the new component group is to be mounted is secured. Therefore, tape feeder 82 in the component mounting program detects the presence or absence of the component by detection sensor 116 in accordance with the component presence or absence confirmation command, and in the component mounting program, when the component is detected and the component mounting work is executed in spite of the empty taping space, there may be a case where the component group cannot be mounted in an appropriate position since the association between the new mounting work on one panel or one board and the taped position of the component group in the component mounting program cannot be grasped.

Accordingly, tape feeder 82 detects the presence or absence of the component by detection sensor 116 in accordance with the component presence or absence confirmation command in the component mounting program, and when the component is detected, tape feeder 82 outputs information indicating that the component is present at the supply position, that is, the component presence information to controller 120. When receiving the component presence information, in the component mounting program, controller 120 executes the error notification from the point where the component is detected in spite of the empty taping space, and outputs the command to stop the component mounting on work heads 60 and 62, tape feeder 82, or the like. Therefore, when the component mounting work is temporarily stopped, so that the operator recognizes the error, it is possible to confirm the supply position of tape feeder 82, or the like. When the operator sets the appropriate sequential taped component 150 in tape feeder 82 such that empty taping space 160 is positioned at the supply position of tape feeder 82, since the control device detects the presence or absence of the component at the component supply position by the detection sensor, and confirms that the component is not detected there, so that the control device can grasp the position of the head of the component group in the sequential tape, it is possible to mount the component group corresponding to one panel or one board at the appropriate position.

In this manner, tape feeder 82 detects the presence or absence of the component by detection sensor 116 in accordance with the component presence or absence confirmation command, so that it is possible to appropriately supply the components from sequential taped component 150 in units of panels or boards. On the other hand, since the detection sensor for detecting the presence or absence of the component at the supply position is not provided in a conventional tape feeder, the appropriate supply of the components from sequential taped component 150 in units of panels or boards is secured without using the detection signal from the detection sensor of the tape feeder.

Specifically, before the new mounting work is executed, work heads 60 and 62 execute a holding work of the component from the supply position in order to confirm that empty taping space 160 is positioned at the supply position of tape feeder 82. At this time, in the component mounting program, since empty taping space 160 in the sequential tape is positioned at the supply position of tape feeder 82, work heads 60 and 62 cannot hold the component. However, work heads 60 and 62 execute an idle striking work of the component in order to confirm that the component is not held. The idle striking work is to execute a mounting work of the component on circuit base material 12 even though work heads 60 and 62 do not hold the component. A through hole for inserting the lead wire is formed in circuit base material 12, and whether the lead wire is inserted into the through hole is detected by the detection sensor or the like. However, even when the idle striking work of the component is executed, since the insertion of the lead wire into the through hole is not detected by the detection sensor or the like, it is further confirmed that the component is not held by work heads 60 and 62. Based on the detection result, it is confirmed that empty taping space 160 is positioned at the supply position of tape feeder 82, and the mounting work of the component group is started.

On the other hand, when work heads 60 and 62 execute the idle striking work of the component, the insertion of the lead wire into the through hole of the circuit base material may be detected. In such a case, the component is held by work heads 60 and 62, and the component is mounted to the through hole of the circuit base material. That is, it is confirmed that the component is supplied to the supply position of tape feeder 82 and empty taping space 160 is not positioned. Therefore, in such a case, the control device sends the error notification, and outputs the command to stop the component mounting work on to work heads 60 and 62, tape feeder 82, or the like, that is, the component mounting stop command.

As described above, since the detection sensor for detecting the presence or absence of the component at the supply position is not provided in the conventional tape feeder, it is necessary to execute a holding operation of no component, an idle striking operation of the component on circuit base material 12, or the like, by the work head, which is much waste. On the other hand, tape feeder 82 is provided with detection sensor 116 for detecting the presence or absence of the component at the supply position, and tape feeder 82 can confirm the presence or absence of the component by detection sensor 116 in accordance with the component presence or absence confirmation command from controller 120. As a result, it is possible to eliminate waste such as the holding operation of no component, the idle striking operation on circuit base material 12, and the like, by the work head, so that it is possible to efficiently and accurately execute the supply of the components from sequential taped component 150 in units of panels or boards.

The mounting work of axial component 90 supplied from usual taped component 88 and the mounting work of axial component 152 supplied from sequential taped component 150 described above are executed by the processing of main program 170 (refer to FIG. 5) and feeder program 172 (refer to FIG. 5). Hereinafter, the processing by main program 170 will be described with reference to the flowcharts in FIGS. 7 and 8, and the processing by feeder program 172 will be described with reference to the flowchart in FIG. 9.

Figure 7:
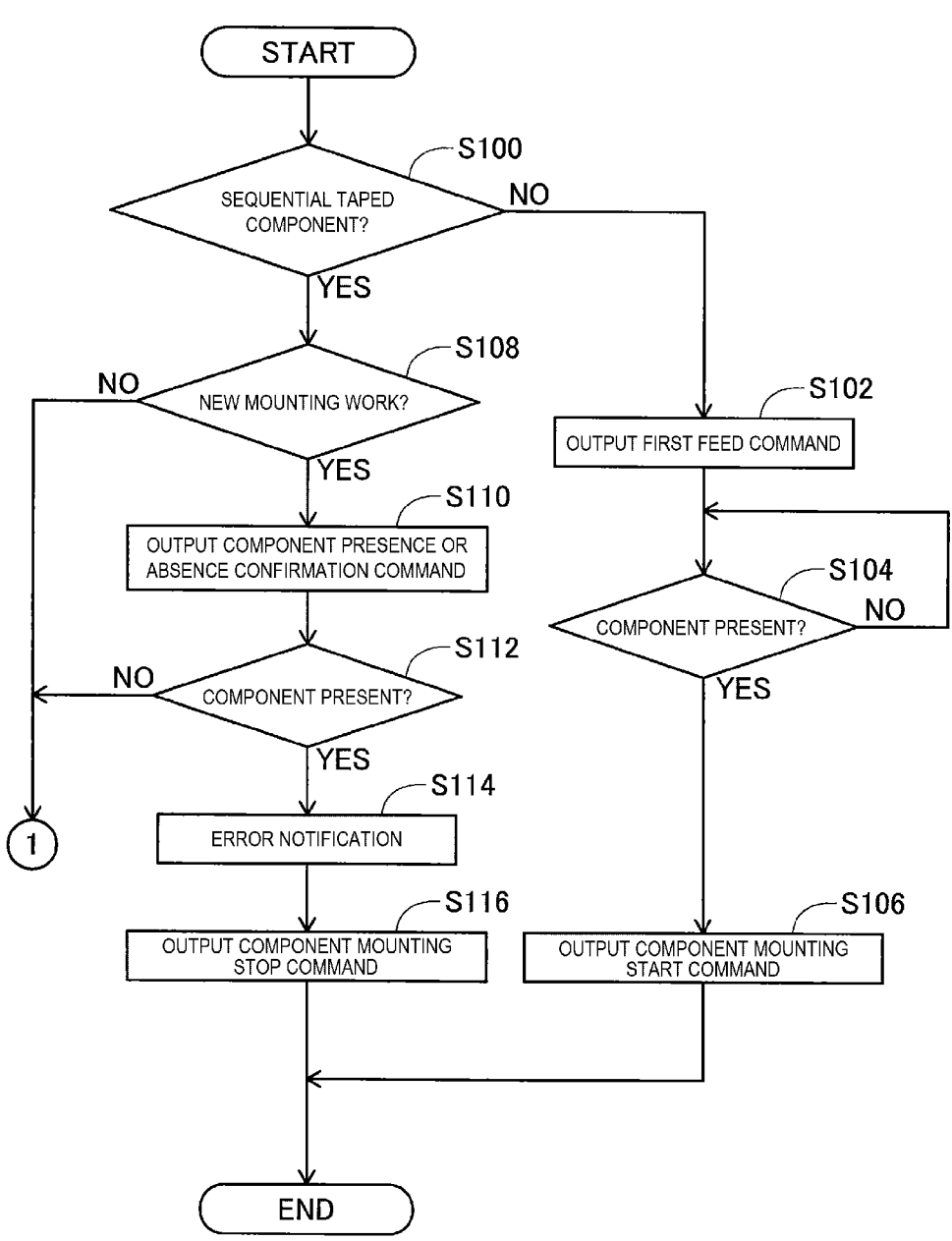
FIG. 7 illustrates a flowchart of a main program.

First, main program 170 is executed by controller 120, and controller 120 determines whether the component, which is the target of the mounting work, is the component supplied from sequential taped component 150, as illustrated in FIG. 7 (step S100). Specifically, a job for executing the component mounting work on the circuit base material is created for each type of circuit base material, and at the time of creating a job according to the type of circuit base material, it is set whether the component, which is the mounting target, is the component supplied from usual taped component 88, the component supplied from sequential taped component 150, or the component supplied from other types of component supply devices. Multiple jobs according to the types of circuit base materials are stored in controller 120, and controller 120 executes the mounting work in accordance with the jobs, which are creation targets, according to the types of circuit base materials. Therefore, controller 120 can identify whether the component, which is the mounting target, is the component supplied from usual taped component 88, the component supplied from sequential taped component 150, or the component supplied from other component supply devices other than the tape feeder by referring to the job. That is, on main program 170, it is possible to identify whether the component supplied from tape feeder 82 is the component supplied from usual taped component 88 or the component supplied from sequential taped component 150.

Then, in a case where it is determined that the component, which is the mounting target, is the component supplied from the tape feeder and not the component supplied from sequential taped component 150 (step S100: NO), that is, in the case where it is determined that the component is the component supplied from usual taped component 88, controller 120 outputs the first feed command to tape feeder 82 (step S102). Next, controller 120 determines whether the component is present at the supply position (step S104). That is, in response to the output of the first feed command, controller 120 determines whether the component presence information has been received from tape feeder 82. At this time, in a case where controller 120 does not receive the component presence information from tape feeder 82 even though the first feed command is output, that is, in a case where the component is absent at the supply position (step S104: NO), the processing in step S104 is repeated. That is, since tape feeder 82 that has received the first feed command outputs the first feed command to repetitively execute the component supply work until the component is detected by detection sensor 116, controller 120 repeats the processing of step S104 until the component presence information is received from tape feeder 82. Then, in a case where controller 120 has received the component presence information from tape feeder 82, that is, in a case where the component is present at the supply position (step S104: YES), controller 120 outputs the component mounting start command to work heads 60 and 62 (step S106). As a result, the mounting work of axial component 90 supplied from usual taped component 88 is executed.

Figure 8:
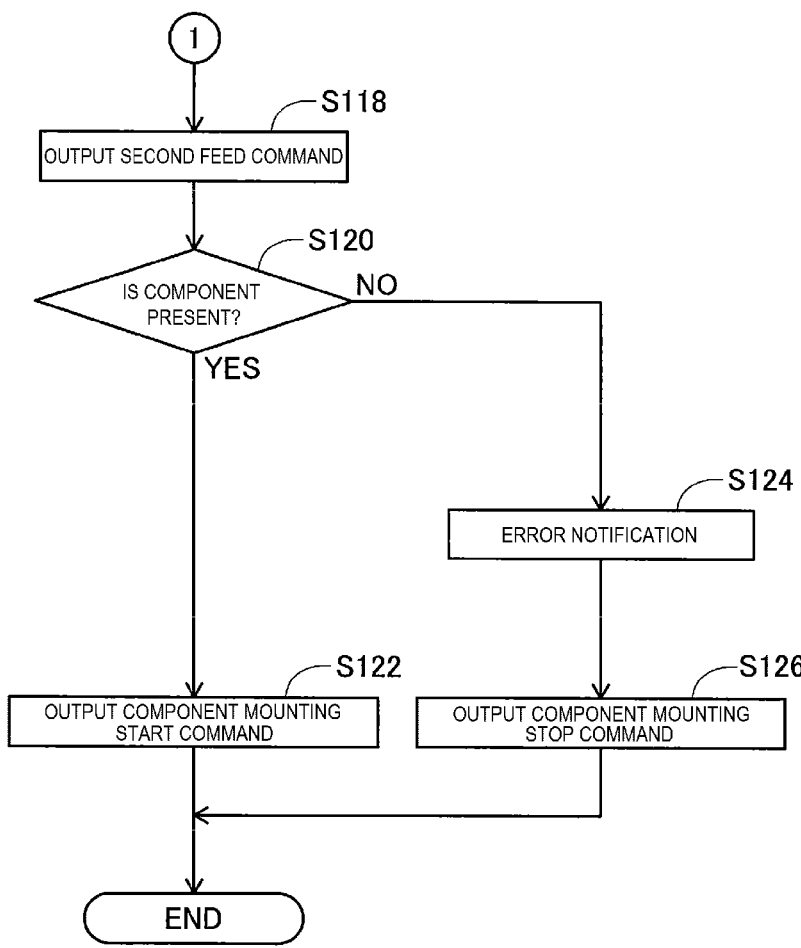
FIG. 8 illustrates a flowchart of the main program.

In addition, in step S100, in a case where it is determined that the component, which is the mounting target, is the component supplied from sequential taped component 150 (step S100: YES), controller 120 determines whether it is a new mounting work (step S108). At this time, in a case where it is a new mounting work (step S108: YES), that is, when the mounting work on one new panel or one new board on the circuit base material is started, or when the mounting work of a new component group is started, controller 120 outputs the component presence or absence confirmation command to tape feeder 82 (step S110). Next, controller 120 determines whether the component is present at the supply position (step S112). That is, in response to the output of the component presence or absence confirmation command, controller 120 determines that the information which has been received from tape feeder 82 is which of the component presence information and the component absence information. At this time, in a case where controller 120 has received the component absence information from tape feeder 82, that is, in the case where the component is absent at the supply position (step S112: NO), it is determined as an empty taping space in the sequential taped component, and as illustrated in FIG. 8, controller 120 outputs the second feed command to tape feeder 82 (step S118).

Subsequently, controller 120 determines whether the component is present at the supply position (step S120). That is, in response to the output of the second feed command, controller 120 determines that the information which has been received from tape feeder 82 is which of the component presence information and the component absence information. At this time, in a case where controller 120 has received the component presence information from tape feeder 82, that is, in the case where the component is present at the supply position (step S120: YES), it is determined that the head component of the component group in the sequential taped component is supplied to the supply position of the tape feeder, and controller 120 outputs the component mounting start command to work heads 60 and 62 (S122). As a result, the mounting work of axial component 90 which is a component group supplied from sequential taped component 152 is executed. On the other hand, in a case where controller 120 has received the component absence information from tape feeder 82, that is, in the case where the component is absent at the supply position (step S120: NO), controller 120 executes the error notification (step S124), and outputs the component mounting stop command to notification devices such as work heads 60 and 62, tape feeder 82, an operation panel, and a signal tower (step S126). As a result, the component mounting work is temporarily stopped, so that the operator can recognize the occurrence of the error.

As illustrated in FIG. 7, in step S112, in a case where controller 120 has received the component presence information from tape feeder 82 in response to the output of the component presence or absence confirmation command (step S110), that is, in the case where it is confirmed that the component is present at the supply position (step S112: YES), controller 120 executes the error notification (step S114), and outputs the component mounting stop command to notification devices such as work heads 60 and 62, tape feeder 82, an operation panel, and a signal tower (step S116). As a result, the component mounting work is temporarily stopped, so that the operator can recognize the occurrence of the error.

In addition, in a case where the mounting work is not the mounting work of a new component group in step S108 (step S108: NO), that is, in the case where it is in the middle of the mounting work on one panel or one board, as illustrated in FIG. 8, the second feed command is output to tape feeder 82 (step S118). Controller 120 determines whether the component is present at the supply position (step S120). That is, in response to the output of the second feed command, controller 120 determines that the information which has been received from tape feeder 82 is which of the component presence information and the component absence information. At this time, in a case where controller 120 has received the component presence information from tape feeder 82, that is, in the case where it is confirmed that the component is present at the supply position (step S120: YES), controller 120 outputs the component mounting start command to work heads 60 and 62 (step S122). As a result, the mounting work of axial component 152 supplied from sequential taped component 150 is executed. On the other hand, in a case where controller 120 has received the component absence information from tape feeder 82, that is, in the case where it is confirmed that the component is absent at the supply position (step S120: NO), controller 120 executes the error notification (step S124), and outputs the component mounting stop command to notification devices such as work heads 60 and 62, tape feeder 82, an operation panel, and a signal tower (step S126). As a result, the component mounting work is temporarily stopped, so that the operator can recognize the occurrence of the error.

Figure 9:
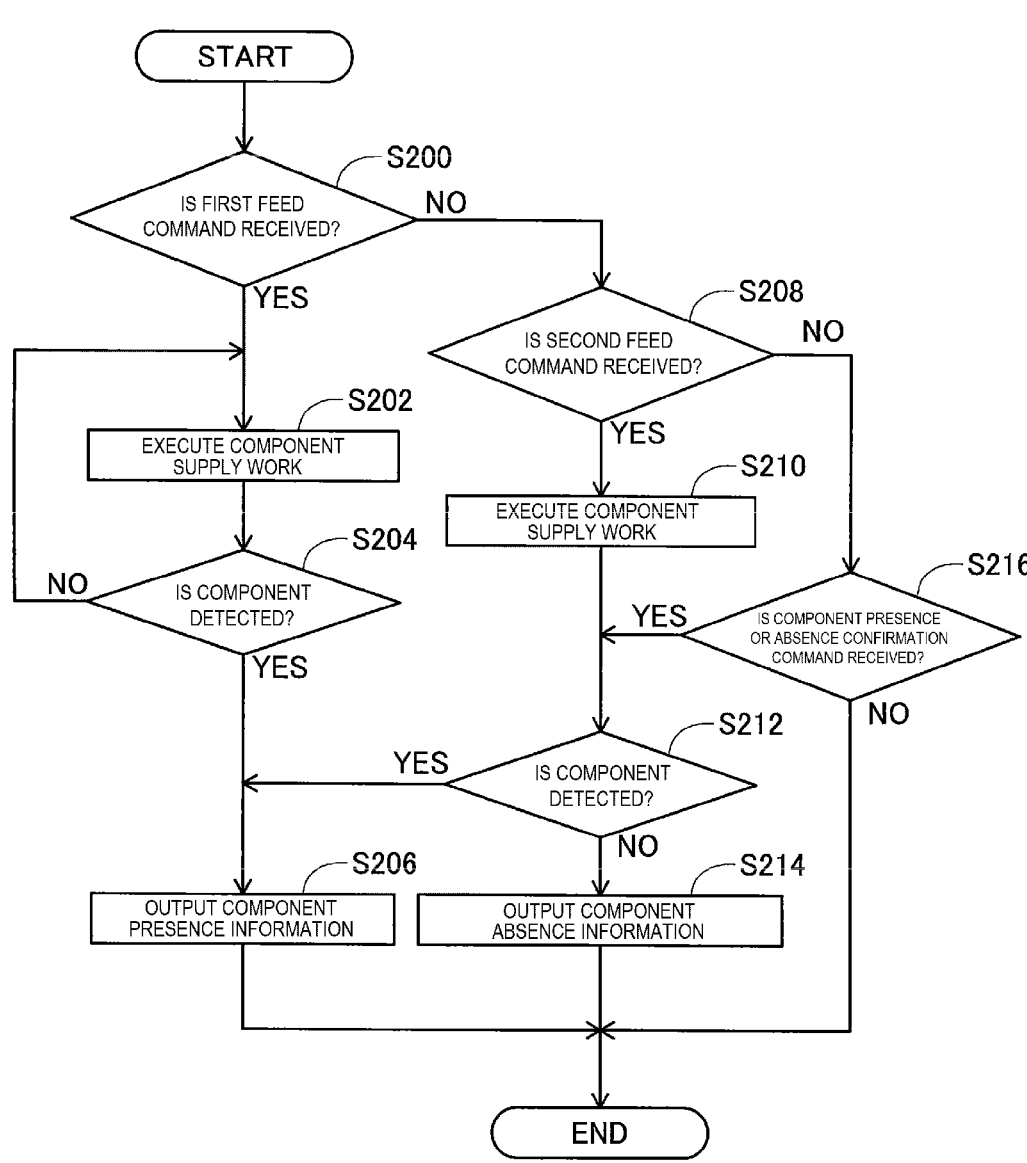
FIG. 9 illustrates a flowchart of a feeder program.

In addition, feeder program 172 is executed by tape feeder 82, and tape feeder 82 determines whether the first feed command has been received from controller 120, as illustrated in FIG. 9 (step S200). At this time, in a case where the first feed command is received (step S200: YES), tape feeder 82 executes the supply work for supplying the taped component to the supply position (step S202). Tape feeder 82 detects the presence or absence of the component at the supply position by detection sensor 116 (step S204). At this time, when it is detected by detection sensor 116 that the component is absent at the supply position (step S204: NO), kinds of processing in steps S202 and S204 are executed again. That is, tape feeder 82 executes the supply work of the taped component at the supply position (step S202), and detects the presence or absence of the component at the supply position by detection sensor 116 (step S204). When it is detected by detection sensor 116 that the component is present at the supply position (step S204: YES), tape feeder 82 outputs the component presence information to controller 120 (step S206). That is, when receiving the first feed command, tape feeder 82 repeats the component supply work and the detection of the presence or absence of the component at the supply position until the component is detected at the supply position by detection sensor 116.

In addition, in step S200, in a case where the first feed command is not received (step S200: NO), tape feeder 82 determines whether the second feed command has received from controller 120 (step S208). At this time, in a case where the second feed command is received (step S208: YES), tape feeder 82 executes the supply work of the taped component at the supply position (step S210). Tape feeder 82 detects the presence or absence of the component at the supply position by detection sensor 116 (step S212). At this time, when it is detected by detection sensor 116 that the component is present at the supply position (step S212: YES), tape feeder 82 outputs a signal indicating the presence of the component to controller 120 (step S206). On the other hand, when it is detected by detection sensor 116 that the component is absent at the supply position (step S212: NO), tape feeder 82 outputs a signal indicating that the absence of the component to controller 120 (step S214).

In addition, in step S208, in a case where the second feed command is not received (step S208: NO), tape feeder 82 determines whether the component presence or absence confirmation command has received from controller 120 (step S216). At this time, in a case where the component presence or absence confirmation command is received (step S216: YES), tape feeder 82 detects the presence or absence of the component at the supply position by detection sensor 116 (step S212). At this time, when it is detected by detection sensor 116 that the component is present at the supply position (step S212: YES), tape feeder 82 outputs a signal indicating the presence of the component to controller 120 (step S206). On the other hand, when it is detected by detection sensor 116 that the component is absent at the supply position (step S212: NO), tape feeder 82 outputs a signal indicating the absence of the component to controller 120 (step S214).

Tape feeder 82 is an example of a tape feeder. Usual taped component 88 is an example of a taped component other than a sequential taped component. Sequential taped component 150 is an example of the sequential taped component. Main program 170 is an example of a component mounting program. In addition, step S110 is an example of confirmation command output means. Step S116 is an example of second stop means. Step S118 is an example of feed command output means. Step S126 is an example of first stop means. The output of the component mounting stop command also has an effect of avoiding mounting the component at a wrong position on the circuit base material or mounting a wrong type of component, or avoiding production of a defective circuit base material caused by an attachment of a wrong type of taped component to the tape feeder, an attachment defect of taped component to the tape feeder, and the like.

In addition, the present disclosure is not limited to the embodiment that has been described heretofore and can be implemented in various aspects with various modifications and improvements based on the knowledge of those skilled in the art. For example, in the above embodiment, it is determined based on the job input to controller 120 whether the component, which is the target of the mounting work, is the component supplied from either of sequential taped component 150 or usual taped component 88. On the other hand, the present disclosure is not limited to the job input to controller 120, and it may be determined by various methods whether the component, which is the target of the mounting work, is the component supplied from either of sequential taped component 150 or usual taped component 88. For example, the operator may input the type of component, which is the target of the mounting work during the mounting work, and determine the target component of the mounting work based on the input value. In addition, for example, imaging device 26 may image tape feeder 82 during the mounting work, and the target component of the mounting work may be determined based on the imaged data. In addition, even in a case where the operator visually recognizes the component mounting program, it is possible to determine that each taped component to be mounted in the component mounting program is the component supplied from which type of taped component.

In the above embodiment, the presence or absence of the component at the supply position is detected by detection sensor 116, but the presence or absence of the component may be detected by another device. For example, the supply position of tape feeder 82 may be imaged by imaging device 26 that moves together with the work head, and the presence or absence of the component at the supply position of each tape feeder may be detected based on the imaged data.

In addition, the present disclosure is applied to the tape feeder for supplying the axial component, but may be applied to a tape feeder for supplying a radial component or a general square type chip tape feeder. That is, regardless of the type of taped component, at the time of supplying the radial component or the square type chip which is taped on the carrier tape, the first feed command, the second feed command, the component presence or absence confirmation command, or the like may be output from controller 120 to the tape feeder, and the tape feeder may operate in accordance with the command.

REFERENCE SIGNS LIST

82: Tape feeder, 88: Usual taped component, 150: Sequential taped component, 170: Main program (component mounting program)

The invention claimed is:

1. A component mounter comprising:

a component mounting device including a work head and a work head moving device;

a camera configured to image a component held by the work head;

a component supply device including a tape feeder; and a controller configured to control the operation of the component mounting device, the camera, and the component supply device for mounting a component from the component supply device on a board, the controller comprising:

a processor configured to:

identify whether a component supplied from a tape feeder on the component mounter is a component supplied from a sequential taped component or a component supplied from a taped component other than the sequential taped component, the sequential taped component being configured with multiple types of components continuously taped in a component group, the component groups being repeatedly taped with an empty space between component groups, when the processor identifies that the component is supplied from the taped component other than the sequential taped component, output a first feed command to the tape feeder until it is determined that the component is present at a supply position, and after outputting the first feed command, output a component mounting start command to a component mounting device of the component mounter, and when the processor identifies that the component is supplied from the sequential taped component:

output a second feed command to the tape feeder when the processor determines that the component is not a new mounting work or the processor determines that the component is a new mounting work and there is no component present at the supply position, and after outputting the second feed command, determine whether the component is present at the supply position, output the component mounting start command to the component mounting device of the component mounter when the component is present at the supply position, and issue an error notification and output a component mounting stop command when the component is not present at the supply position, and when the processor determines that the component is a new mounting work and there is a component present at the supply position, issue the error notification and output the component mounting stop command.

* * * * *